United States Patent
Zhang et al.

(10) Patent No.: US 12,007,726 B2
(45) Date of Patent: Jun. 11, 2024

(54) WEARABLE DEVICE AND HOUSING THEREOF

(71) Applicant: GOERTEK INC., Shandong (CN)

(72) Inventors: Xianjun Zhang, Shandong (CN); Jinwei Wang, Shandong (CN); Ping Gong, Shandong (CN)

(73) Assignee: GOERTEK INC., Shandong (CN)

( * ) Notice: Subject to any disclaimer, the term of this patent is extended or adjusted under 35 U.S.C. 154(b) by 760 days.

(21) Appl. No.: 17/263,060

(22) PCT Filed: Dec. 27, 2018

(86) PCT No.: PCT/CN2018/124163
§ 371 (c)(1),
(2) Date: Jan. 25, 2021

(87) PCT Pub. No.: WO2020/019669
PCT Pub. Date: Jan. 30, 2020

(65) Prior Publication Data
US 2021/0263479 A1    Aug. 26, 2021

(30) Foreign Application Priority Data
Jul. 27, 2018 (CN) .......................... 201810844390.9

(51) Int. Cl.
*G04G 17/08* (2006.01)
*G04B 37/08* (2006.01)
(Continued)

(52) U.S. Cl.
CPC ............. *G04G 17/08* (2013.01); *G04B 37/08* (2013.01); *G04B 47/06* (2013.01); *H05K 5/0086* (2013.01); *H05K 5/0213* (2013.01)

(58) Field of Classification Search
CPC ........ G04G 17/08; G04B 37/08; G04B 37/10; G04B 37/106
See application file for complete search history.

(56) References Cited

U.S. PATENT DOCUMENTS

| | | | | |
|---|---|---|---|---|
| 5,334,799 A | * | 8/1994 | Naito | H01M 50/24 |
| | | | | 174/547 |
| 8,876,371 B2 | * | 11/2014 | Behrend | G04G 17/08 |
| | | | | 368/286 |

(Continued)

FOREIGN PATENT DOCUMENTS

| CN | 103369897 A | 10/2013 |
|---|---|---|
| CN | 107592970 B | 12/2016 |

(Continued)

OTHER PUBLICATIONS

International Search Report, English Translation from PCT/CN2018/124163 filed Dec. 27, 2018, dated Mar. 28, 2019.

(Continued)

*Primary Examiner* — Edwin A. Leon
*Assistant Examiner* — Jason M Collins
(74) *Attorney, Agent, or Firm* — Workman Nydegger

(57) ABSTRACT

A housing includes: a housing body, having a cavity therein, with a first through hole in an outer wall thereof. The first through hole is in communication with the cavity, a first separate plate and a second separate plate are provided in the cavity, a gap between the first separate plate and an inner wall at one side of the cavity is in communication with the first through hole. A first recess for placing a water absorption device is provided between the first separate plate and the second separate plate, a bottom of a second recess between the second separate plate and the inner wall at another side of the cavity is in communication with the first through hole. A partial bottom of second recess close to first through hole is at a lower position than another partial bottom of second recess away from first through hole.

10 Claims, 3 Drawing Sheets

(51) Int. Cl.
*G04B 47/06* (2006.01)
*H05K 5/00* (2006.01)
*H05K 5/02* (2006.01)

(56) References Cited

U.S. PATENT DOCUMENTS

| | | | |
|---|---|---|---|
| 10,955,397 B2* | 3/2021 | Voumard | G08B 21/182 |
| 11,402,803 B2* | 8/2022 | Nakanishi | G04C 3/146 |
| 2013/0258563 A1 | 10/2013 | Lai | |
| 2017/0051769 A1* | 2/2017 | Hilario | G04G 17/08 |
| 2018/0356861 A1* | 12/2018 | Ichikawa | G06F 1/1688 |
| 2019/0037717 A1 | 1/2019 | Gu et al. | |
| 2019/0191580 A1* | 6/2019 | Yang | G06F 1/163 |

FOREIGN PATENT DOCUMENTS

| | | |
|---|---|---|
| CN | 206807941 U | 12/2017 |
| CN | 207011164 U | 2/2018 |
| CN | 108873677 A | 11/2018 |
| CN | 108873678 A | 11/2018 |
| CN | 208432868 U | 1/2019 |
| CN | 208432869 U | 1/2019 |
| CN | 107615900 B | 12/2019 |
| JP | 2017-011466 A | 1/2017 |

OTHER PUBLICATIONS

Chinese First Office Action, dated Mar. 11, 2023, from Chinese Patent App. No. 201810844390.9.

* cited by examiner

WEARABLE DEVICE AND HOUSING THEREOF

The present application is a national phase application of PCT international patent application PCT/CN2018/124163, filed on Dec. 27, 2018 which claims priority to Chinese Patent Application No. 201810844390.9, titled "WEARABLE DEVICE AND HOUSING THEREOF", filed on Jul. 27, 2018 with the China National Intellectual Property Administration (CNIPA), both of which are incorporated herein by reference in their entireties.

TECHNICAL FIELD

The present disclosure relates to the technical field of housing manufacturing, and in particular to a wearable device and a housing of the wearable device.

BACKGROUND

Nowadays, a research and development trend of a consumer electronic product is becoming more and more miniaturized and integrated, which requires the product to simplify the structure as much as possible on the premise of satisfying the use of functions. The emergency of a wearable device, such as a smart watch or a smart bracelet, has attracted the attention of many consumers. Consumers hope that the watch has rich functions and should be more beautiful. However, the increase of some functions is bound to be related to the size and the shape of the watch body.

The waterproof requirements of the smart watch are getting higher and higher, and the waterproof level is from IP6, TP7 to 3 ATM, 4 ATM and 5 ATM. The waterproof design is generally glued to sealed, which results in a sealed space inside the housing. When in a high temperature and high humidity environment, the watch body is prone to cracking, so a balance hole will generally be added in the watch body, which will affect the appearance and increase the cost. The balance hole is easy to enter water and impurities such as mud, sand, or dust.

Therefore, those skilled in the art have a strong desire is how to provide a housing to achieve waterproof and impurity prevention.

SUMMARY

In view of this, an object of the present disclosure is to provide a housing to achieve waterproof and impurity prevention. Another object of the present disclosure is to provide a wearable device using the housing.

In order to achieve the above objects, the following technical solutions are provided according to the present disclosure provides.

A housing, applied to a wearable device, includes a housing body, a cavity is provided inside the housing, a first through hole is provided in an outer wall of the housing body, and the first through hole is in communication with the cavity. A first separate plate and a second separate plate are provided in the cavity, a gap between the first separate plate and an inner wall at one side of the cavity is in communication with the first through hole; a first recess for placing a water absorption device is provided between the first separate plate and the second separate plate, a bottom of a second recess between the second separate plate and the inner wall at another side of the cavity is in communication with the first through hole; and a partial bottom of the second recess close to the first through hole is at lower position than another partial bottom of the second recess away from the first through hole.

Preferably, the first separate plate and the second plate are both arc-shaped walls, and together form an annular wall, an annular gap is left between the annular wall and the inner wall of the cavity, and the bottom of the second recess is in communication with the first through hole.

Preferably, a top of the first separate plate is an inclined surface, and a height of the inclined surface on the side close to the first through hole is lower than a height of the inclined surface on the side away from the first through hole.

Preferably, a lowest part of the second recess is in communication with the first through hole.

The present disclosure also provides a wearable device including a housing, and the housing is the housing as described in any one of the above.

Preferably, the wearable device also includes a water absorption device, a first reinforcing plate and a barometer. Among them, the water absorption device is placed in the first recess, the first reinforcing plate is arranged above the water absorption device, the first reinforcing plate is provided with a second through hole and the second through hole is aligned with the water absorption device, and the first through hole is staggered from the second through hole, the barometer is placed above the first reinforcing plate, and an inner cavity of the barometer is configured to cover the second through hole.

Preferably, the water absorption device is water absorbing foam, including a foam body and a sand control net covering the foam body.

Preferably, a waterproof membrane is provided on a lower surface of the first reinforcing plate, and the waterproof membrane is configured to cover the bottom of the second through hole.

Preferably, an outer cavity of the barometer is in communication with the cavity of the housing, and the outer cavity of the barometer is in communication with the inner cavity of the barometer through a third through hole.

Preferably, a sealing rubber ring is interference fit between an outer wall of the barometer and an inner wall of the cavity of the housing.

Preferably, the wearable device also includes a second reinforcing plate and a third reinforcing plate, the second reinforcing plate is an FPC, and the third reinforcing plate is a barometer reinforcing plate. One side of the second reinforcing plate is pressed on a barometer plate body, and the third reinforcing plate, barometer buffer foam, and a barometer fixing plate are sequentially arranged above the second reinforcing plate.

The housing according to the present disclosure is applied to a wearable device and includes a housing. A cavity is provided inside the housing, a first through hole is provided in the outer wall of the housing, and the first through hole is communicated with the cavity. A first separate plate and a second separate plate are provided in the cavity, a gap between the first separate plate and the inner wall at one side of the cavity is communicated with the first through hole; a first recess for placing a water absorption device is provided between the first separate plate and the second separate plate, the bottom of a second recess between the second separate plate and the inner wall at the other side of the cavity is communicated with the first through hole; and the height of the second recess on the side close to the first through hole at the bottom of the second recess is lower than the height on the side away from the first through hole.

According to the housing provided by the present disclosure, after gas enters from the first through hole as a vent, gas flows above the first recess where the water absorption device is placed and the water is absorbed by the water absorption device; and since the bottom of the second recess is configured as an inclined surface, fine mud and sand will accumulate along the inclined surface and flow out from the first through hole, achieving waterproof and impurity prevention.

BRIEF DESCRIPTION OF THE DRAWINGS

For more clearly illustrating embodiments of the present disclosure or the technical solutions in the conventional technology, drawings to be used in the description of the embodiments or the conventional technology will be briefly described hereinafter. Apparently, the drawings in the following description are only some embodiments of the present disclosure. For those skilled in the art, other drawings may be obtained based on the provided drawings without any creative work.

REFERENCE NUMERAL IN FIG. 1 TO FIG. 3

1 housing body, 2 water absorbing foam,
3 waterproof membrane, 4 first reinforcing plate,
5 inner cavity of barometer, 6 outer cavity of barometer,
7 sealing rubber ring, 8 barometer plate body,
9 FPC, 10 barometer reinforcing plate,
11 barometer buffer foam, 12 barometer fixing plate,
13 first through hole, 14 first separate plate,
15 second separate plate, 16 first recess,
17 second recess, 18 cavity,
19 annular gap.

DETAILED DESCRIPTION OF THE EMBODIMENTS

The following will clearly and completely describe the technical solutions in the embodiments of the present disclosure in conjunction with the accompanying drawings in the embodiments of the present disclosure. Obviously, the described embodiments are only a part of the embodiments of the present disclosure, not all embodiments. Based on the embodiments of the present disclosure, all other embodiments obtained by those having ordinary skill in the art without creative work shall fall within the protection scope of the present disclosure.

Figure 1:
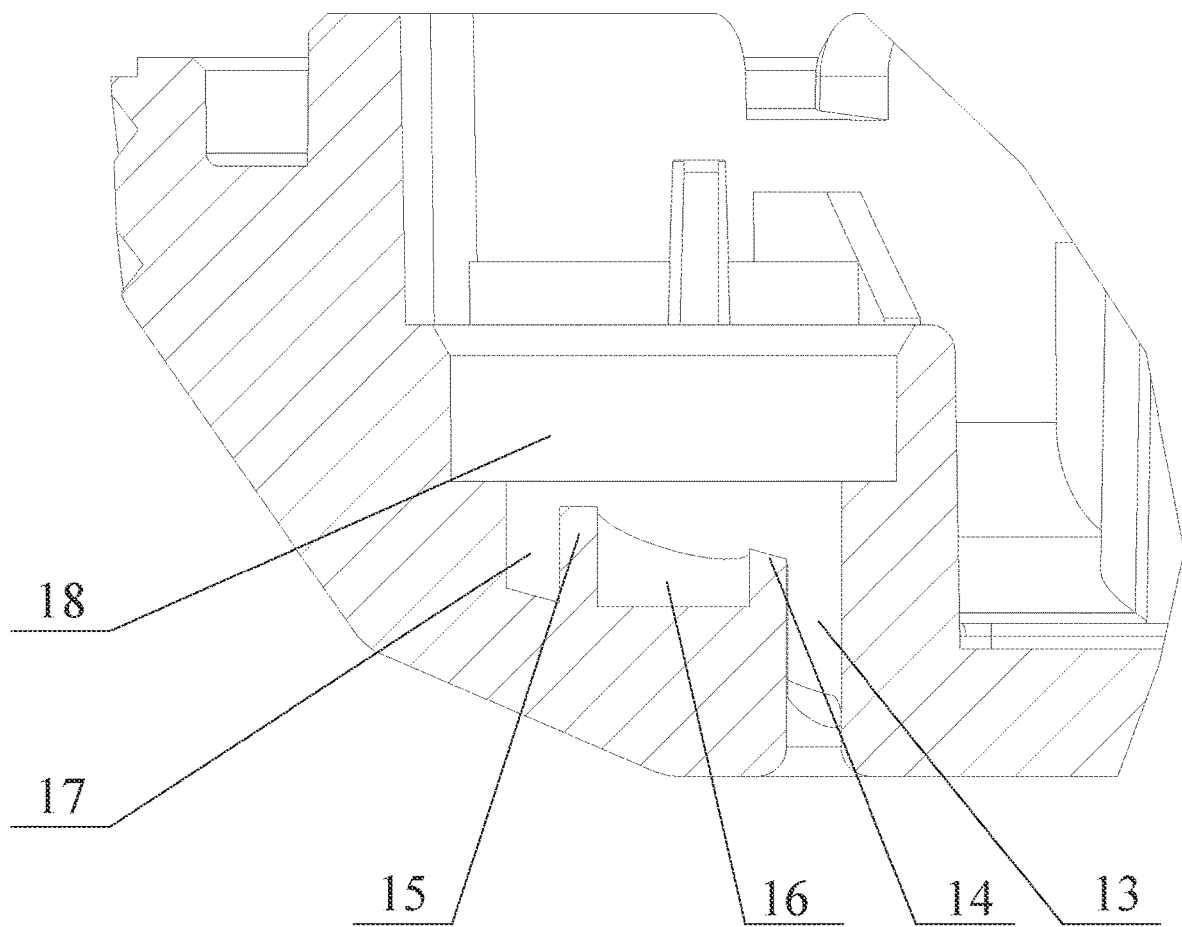
FIG. 1 is a schematic side cross-sectional view showing the structure of a housing according to an embodiment of the present disclosure.
Figure 2:
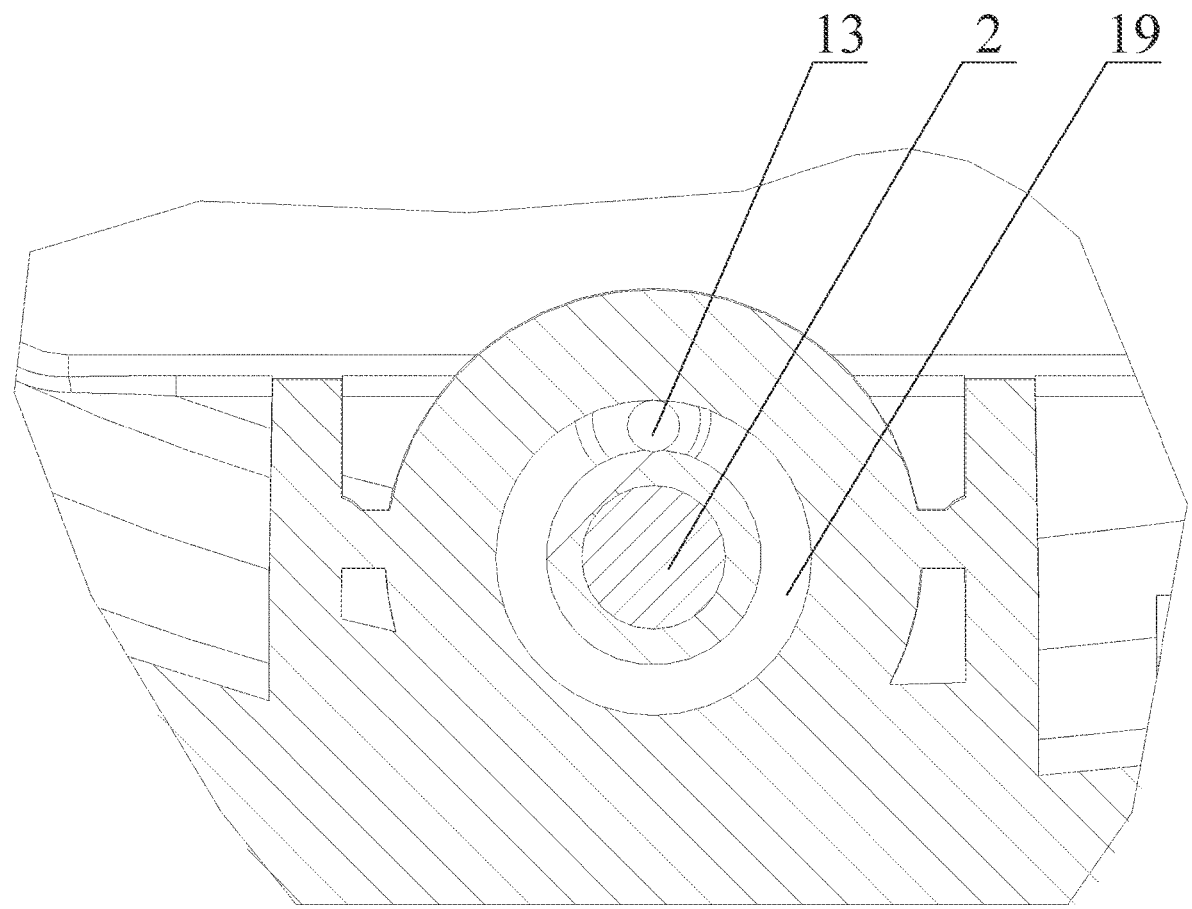
FIG. 2 is a schematic top cross-sectional view showing the structure of a housing according to an embodiment of the present disclosure.
Figure 3:
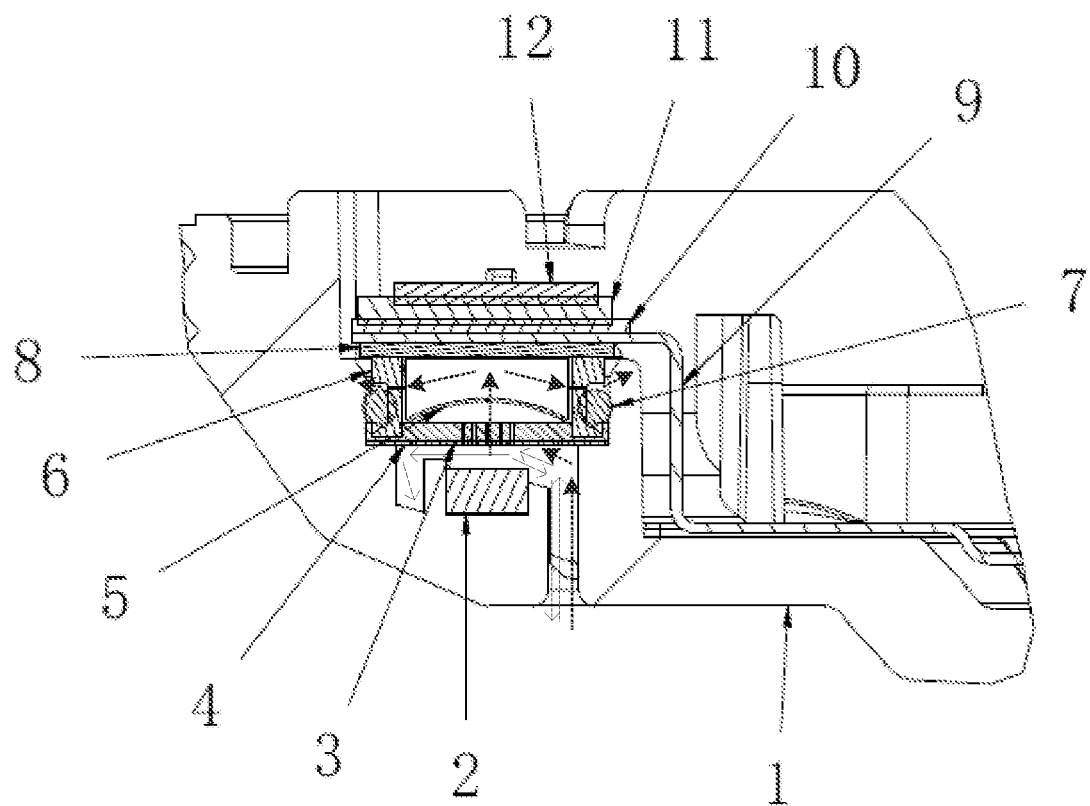
FIG. 3 is a schematic partial cross-sectional view showing the structure of a wearable device according to an embodiment of the present disclosure.

Referring to FIG. 1 to FIG. 3, FIG. 1 is a schematic side cross-sectional view showing the structure of a housing according to an embodiment of the present disclosure; FIG. 2 is a schematic top cross-sectional view showing the structure of a housing according to an embodiment of the present disclosure; and FIG. 3 is a schematic partial cross-sectional view showing the structure of a wearable device according to an embodiment of the present disclosure.

The housing according to the present disclosure is applied to a wearable device, and may be a lower housing, including a housing body 1, a cavity 18 is provided inside the housing body 1, a first through hole 13 is provided in the outer wall of the housing body 1, and the first through hole 13 is in communication with the cavity 18. A first separate plate 14 and a second separate plate 15 are provided in the cavity 18, a gap between the first separate plate 14 and the inner wall at one side of the cavity 18 is in communication with the first through hole 13; a first recess 16 for placing a water absorption device is provided between the first separate plate 14 and the second separate plate 15, the bottom of a second recess 17 between the second separate plate 15 and the inner wall at another side of the cavity 18 is in communication with the first through hole 13. A partial bottom of the second recess 17 close to the first through hole 13 is at a lower position than another partial bottom of the second recess 17 away from the first through hole 13.

According to the housing provided by the present disclosure, after gas enters from the first through hole 13 as a vent, gas flows above the first recess 16 where the water absorption device is placed and the water is absorbed by the water absorption device; and since the bottom of the second recess 17 is configured as an inclined surface, fine mud and sand will accumulate along the inclined surface and flow out from the first through hole 13, achieving waterproof and impurity prevention.

In specific embodiment, the first separate plate 14 and the second plate 15 are both arc-shaped walls, and together form an annular wall, and an annular gap 19 is left between the annular wall and the inner wall of the cavity 18, and the bottom of the second recess 17 is in communication with the first through hole 13.

The top of the first separate plate 14 is an inclined surface, and the height of the inclined surface on the side close to the first through hole 13 is lower than the height of the inclined surface on the side away from the first through hole 13. The lowest part of the second recess 17 is in communication with the first through hole 13, further facilitating the removal of impurities.

A wearable device is further provided according to an embodiment of the present disclosure, including a housing, and the housing is the housing as described in any one of the foregoing embodiments. The wearable device includes but not limited to devices such as smart watches, smart bracelets, and tracking locators. The wearable device further includes a water absorption device, a first reinforcing plate 4 and a barometer. The water absorption device is placed in the first recess 16, the first reinforcing plate 4 is arranged above the water absorption device, the first reinforcing plate is provided with a second through hole and the second through hole is aligned with the water absorption device, and the first through hole 13 is staggered from the second through hole, and an inner cavity of the barometer 5 and the first through hole 13 are not concentric. The barometer is placed above the first reinforcing plate 4, and the inner cavity of the barometer 5 is configured to cover the second through hole. The water absorption device is water absorbing 2, including a foam body and a sand control net covering the foam body. The water absorption device may also be a water-absorbent resin, a waterproof membrane 3 is provided on the lower surface of the first reinforcing plate 4, and the waterproof membrane 3 is configured to cover the bottom of the second through hole. An outer cavity of the barometer 6 is in communication with the cavity 18 of the housing, and the outer cavity of the barometer 6 is in communication with the barometer inner cavity 5 through a third through hole. A sealing rubber ring 7 is interference fit between the outer wall of the barometer and the inner wall of the cavity 18 of the housing.

The wearable device also includes a second reinforcing plate and a third reinforcing plate. The second reinforcing plate is an FPC, and the FPC is a flexible circuit board, which is called Free Pascal Compiler in English. It is a conventional technology and is a highly reliable and excellent flexible printed circuit board made of polyimide or polyester film. Referred to as soft board or FPC, it has the characteristics of high wiring density, light weight, and thin thickness. Here it is used to electrically connect the barometer and PCB. The third reinforcing plate is a barometer reinforcing plate 10. One side of the second reinforcing plate is pressed on a barometer plate body 8, and the third reinforcing plate, barometer buffer foam 11, and a barometer fixing plate 12 are sequentially arranged above the second reinforcing plate.

Specifically, a sand control net is integrated on the water absorbing foam 2 to prevent sediment from entering the water absorbing foam 2, and the waterproof membrane 3 is made of GAW325. The axis of the first through hole 13 opened on the lower housing is not concentric with the barometer. The area of the lower housing near the through hole is made with one side high and the other low. When assembling, first the water absorbing foam 2 is fixed inside the first recess 16 on the lower housing, and the waterproof membrane 3 is attached to the barometer reinforcing steel sheet, that is, the first reinforcing plate 4. The sealing rubber ring 7 is fixed in the annular recess of the outer cavity of the barometer 6, and finally the steel sheet is fixed with the barometer, that is, the barometer fixing plate 12 is used to fix the entire barometer module.

The entry of gas is shown by the dotted arrow in FIG. 3. The gas enters from the air pressure balance hole opened in the lower housing of the watch, that is, from the first through hole 13. When the gas passes through the water absorbing foam 2, a part of the water vapor is absorbed. Since the waterproof membrane 3 is a one-way membrane, only gas is allowed to enter and the liquid is blocked outside. The gas then passes through the barometer reinforcing steel sheet. Since the bottom of the steel sheet has a vent hole, that is, the second through hole, the gas is able to pass smoothly. When the gas enters the space between the barometer reinforcing steel sheet and the inner cavity of the barometer 5, gas exchange is realized, and interference fit between the sealing rubber ring 7 and the lower housing further improves the waterproof performance.

The principle of sand control is as follows, as shown by the solid arrow in FIG. 3, when fine sand enters the cavity 18 of the lower housing through the first through hole 13 on the lower housing, under the action of the inclined surface of the bottom of the second recess 17 and the inclined surface of the top of the separate plate 14, most of the sand automatically slides out. When a small part of the sand enters the cavity, the sand accumulates in the second recess 17. Due to the large difference between the left and right heights of the second recess 17, the sand flows from high to low, and the lowest part is in communication with the first through hole 13, and the sand eventually flows out of the housing body 1 from the through hole 13.

The wearable device is provided according to the embodiment of the present disclosure, in the aspect of the waterproof: water absorbing foam 2, a waterproof membrane 3 and a sealing rubber ring 7 are used to improve the waterproof performance; in the aspect of the sediment prevention: the sand control net covering on the water absorbing foam 2, the reinforcing steel sheet, and the oblique hole structure of the lower housing are used to improve the sand prevention function.

The above illustration of the disclosed embodiments can enable those skilled in the art to implement or use the present application. Various modifications to the embodiments are apparent to the person skilled in the art, and the general principle herein can be implemented in other embodiments without departing from the spirit or scope of the present application. Therefore, the present application is not limited to the embodiments described herein, but should be in accordance with the broadest scope consistent with the principle and novel features disclosed herein.

It should also be noted that in this article, relational terms such as first and second are only used to distinguish one entity or operation from another entity or operation, and do not necessarily require or imply any such actual relationship or order between these entities or operations. Moreover, the terms "contain", "include" or any other variants thereof are intended to cover non-exclusive inclusion, so that a process, method, article, or device including a series of elements not only includes those elements, but also includes other elements that are not explicitly listed, or also includes elements inherent to this process, method, article, or equipment. If there are no more restrictions, the element defined by the sentence "including a . . . " does not exclude the existence of other same elements in the process, method, article, or equipment that includes the element.

The invention claimed is:

1. A housing, applied to a wearable device, comprising:
   a housing body, having a cavity therein, with a first through hole being provided in an outer wall of the housing body, wherein the first through hole is in communication with the cavity, wherein
   a first separate plate and a second separate plate are provided in the cavity, a gap between the first separate plate and an inner wall at one side of the cavity is in communication with the first through hole;
   a first recess for placing a water absorption device is provided between the first separate plate and the second separate plate, a bottom of a second recess between the second separate plate and the inner wall at another side of the cavity is in communication with the first through hole; and
   the bottom of the second recess comprises a first side close to the first through hole and a second side away from the first through hole, wherein a height of the first side is lower than a height of the second side.

2. The housing according to claim 1, wherein the first separate plate and the second plate are both arc-shaped walls, and together form an annular wall, an annular gap is left between the annular wall and the inner wall of the cavity, and the bottom of the second recess is in communication with the first through hole.

3. The housing according to claim 1, wherein a top of the first separate plate is an inclined surface, and a height of the inclined surface on the side close to the first through hole is lower than a height of the inclined surface on the side away from the first through hole.

4. The housing according to claim 1, wherein a lowest part of the second recess is in communication with the first through hole.

5. A wearable device, comprising a housing, wherein the housing is the housing according to claim 1.

6. The wearable device according to claim 5, further comprising:
   an water absorption device;

a first reinforcing plate; and
a barometer, wherein
the water absorption device is placed in the first recess, the first reinforcing plate is arranged above the water absorption device, the first reinforcing plate is provided with a second through hole and the second through hole is aligned with the water absorption device, and the first through hole is staggered from the second through hole, the barometer is placed above the first reinforcing plate, and an inner cavity of the barometer is configured to cover the second through hole.

7. The wearable device according to claim 6, wherein the water absorption device is water absorbing foam, comprising a foam body and a sand control net covering the foam body.

8. The wearable device according to claim 6, wherein a waterproof membrane is provided on a lower surface of the first reinforcing plate, and the waterproof membrane is configured to cover the bottom of the second through hole.

9. The wearable device according to claim 6, wherein an outer cavity of the barometer is in communication with the cavity of the housing, and the outer cavity of the barometer is communication with the inner cavity of the barometer through a third through hole.

10. The wearable device according to claim 6, wherein a sealing rubber ring is interference fit between an outer wall of the barometer and an inner wall of the cavity of the housing.

\* \* \* \* \*